US006843662B2

(12) United States Patent
Ju

(10) Patent No.: US 6,843,662 B2
(45) Date of Patent: Jan. 18, 2005

(54) ELECTRIC CONNECTOR HOUSING SUPPORTING A PLURALITY OF SOLDER BALLS AND INCLUDING A PLURALITY OF PROTRUDING BLOCKS RESPECTIVELY SUPPORTING THE PLURALITY OF SOLDER BALLS

(76) Inventor: Ted Ju, No. 15, Wu Shiunn St., An Len District, Keelung City (TW)

( * ) Notice: Subject to any disclaimer, the term of this patent is extended or adjusted under 35 U.S.C. 154(b) by 0 days.

(21) Appl. No.: 10/401,884

(22) Filed: Mar. 31, 2003

(65) Prior Publication Data

US 2004/0192087 A1 Sep. 30, 2004

(51) Int. Cl.$^7$ ............................ H01R 12/00; H05K 1/00
(52) U.S. Cl. ........................................ 439/83; 439/876
(58) Field of Search .............................. 439/83, 70, 78, 439/876, 875, 342, 362

(56) References Cited

U.S. PATENT DOCUMENTS 6,378,756 B1 * 4/2002 Takahashi et al. .......... 228/159
6,533,590 B1 * 3/2003 Lee et al. ..................... 439/83

* cited by examiner

Primary Examiner—Hae Moon Hyeon
(74) Attorney, Agent, or Firm—Vardnell & Vardnell, PLLC

(57) ABSTRACT

An electric connector is disclosed to include an electrically insulative housing, the housing having a plurality of terminal slots and a protruded block in each terminal slot near the bottom side, a plurality of U-shaped terminals respectively mounted in the terminal slots in the housing, each terminal having two bonding ends held between two opposite lateral sidewalls of the corresponding terminal slot and two sides of the corresponding protruded block, and a plurality of solder balls located on the bottom side of the housing and supported on the protruded block in each terminal slot and clamped between the bonding ends of each terminal.

6 Claims, 3 Drawing Sheets

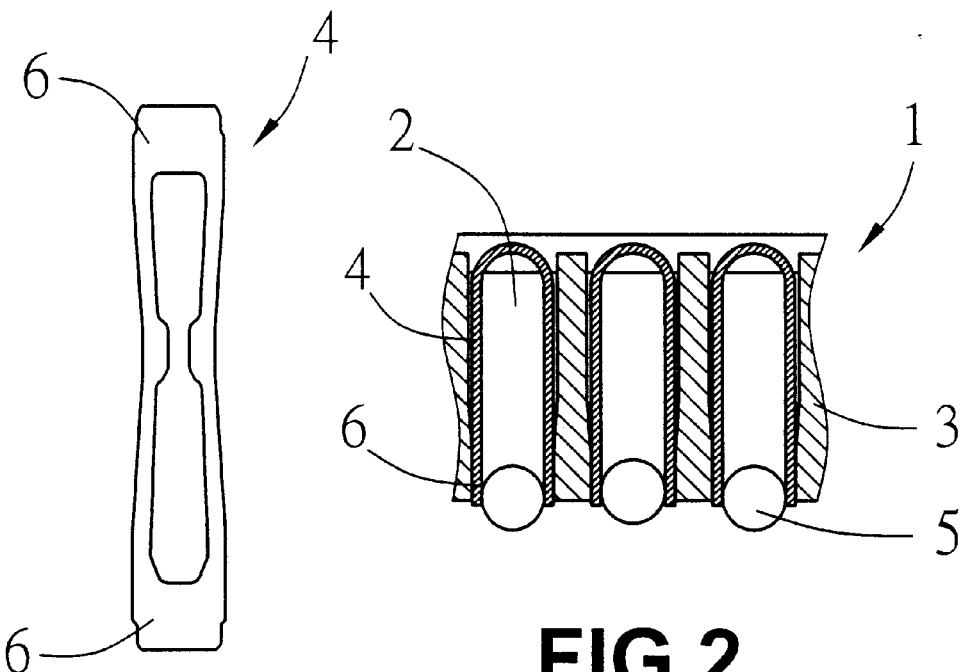
FIG.1
FIG.2
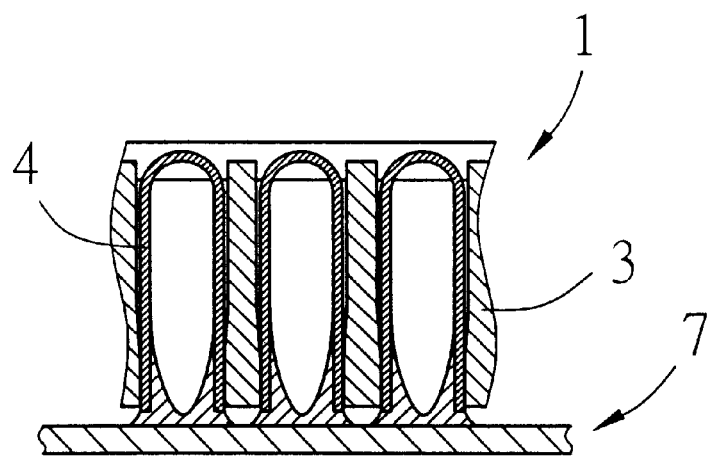
FIG.3

ELECTRIC CONNECTOR HOUSING SUPPORTING A PLURALITY OF SOLDER BALLS AND INCLUDING A PLURALITY OF PROTRUDING BLOCKS RESPECTIVELY SUPPORTING THE PLURALITY OF SOLDER BALLS

BACKGROUND OF THE INVENTION (a) Field of the Invention

The present invention relates to electric connectors and, more particularly, to such an electric connector that can be positively soldered to a circuit board.

(b) Description of the Prior Art

According to conventional BGA type electric connectors, the connection between the terminals and the solder balls can be achieved through either of two ways, namely, the pre-soldering -method and the clamping method. The clamping method is easy and inexpensive to apply because it eliminates a pre-soldering process. However, the clamping method may cause a siphon effect, resulting instable bonding. FIGS. 1~3 show an electric connector constructed according to the aforesaid clamping method. As illustrated, the electric connector 1 is comprised of an electrically insulative housing 3 having a plurality of terminal slots 2, a plurality of terminals 4 respectively mounted in the terminal slots 2 of the housing 3, and a plurality of solder balls 5 located on the bottom side of the housing 3 and respectively connected to the terminals 4 for soldering to a circuit board 7. The terminals 4 are respectively made of a metal plate stamped into a substantially U-shaped profile, each having two bonding ends 6 respectively clamped on the, corresponding solder ball 5. This design of electric connector has drawbacks. One drawback of this design of electric connector is that the solder balls are not aligned in a line when respectively clamped by the bonding ends of the terminals in the terminal slots, affecting the bonding stability of the terminals to the circuit board. Another drawback of this design of electric connector is that a siphon effect will be produced when soldering the solder balls to the circuit board, thereby causing a part of the molten solder to be sucked into the inside of the terminal slots. When cooled down after bonding, some bonding ends of the terminals may not be positively secured to the circuit board.

SUMMARY OF THE INVENTION

The present invention has been accomplished under the circumstances in view. It is the main object of the present invention to provide an electric connector, which can positively be secured to respective contacts of a circuit board. It is another object of the present invention to provide an electric connector, which supports solder balls firmly in position for bonding. To achieve these and other objects of the present invention, the electric connector comprises an electrically insulative housing, the housing having a top side, a bottom side, a plurality of terminal slots extended through the top side and the bottom side, a plurality of U-shaped terminals respectively mounted in the terminal slots, the terminals each having two bonding ends, and a plurality of solder balls located on the bottom side of the housing, and respectively connected to the bonding ends of the terminals in the terminal slots, wherein the housing comprises a plurality of protruded blocks respectively suspended in the terminal slots near the bottom side and equally spaced from two opposite lateral sides of each of the terminal slots and adapted to support the solder balls in the bottom side and the two bonding ends of each of the terminals in contact with the solder balls respectively.

BRIEF DESCRIPTION OF THE DRAWINGS

FIG. 1 is an extended out view of a terminal for an electric connector according to the prior art.

FIG. 2 is a sectional view of a part of the prior art electric connector.

FIG. 3 is a sectional view showing the prior art electric connector bonded to a circuit board.

DETAILED DESCRIPTION OF THE PREFERRED EMBODIMENTS

Figure 5:
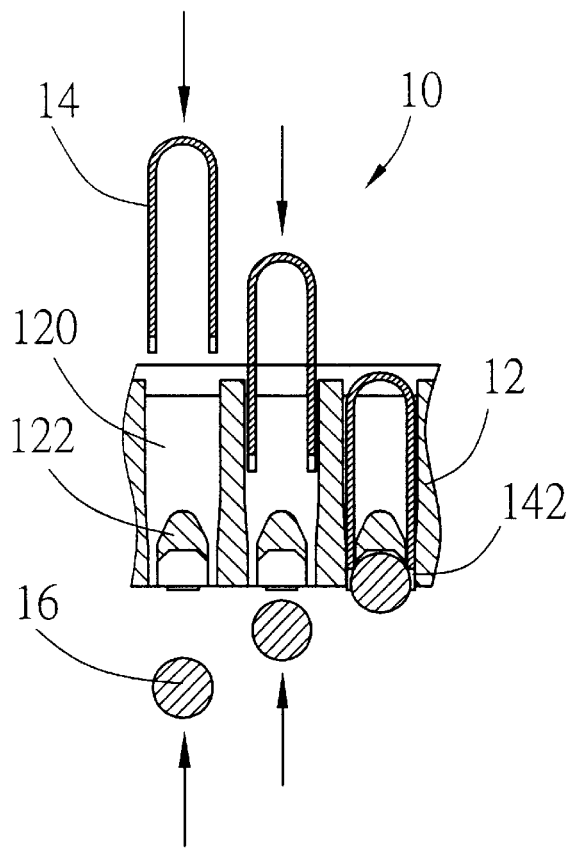
FIG. 5 is a schematic drawing showing the installation of the terminals and the solder balls in the housing according to the present invention.

Referring to FIGS. 4~7, an electric connector 10 is shown comprised of an electrically insulative housing 12 having a plurality of terminal slots 120, a plurality of terminals 14 respectively mounted in the terminal slots 120 of the housing 12, and a plurality of solder balls 16 located on the bottom side of the housing 12 and respectively connected to the terminals 14.

Figure 4:
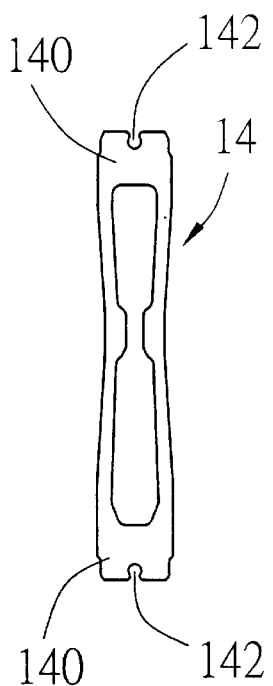
FIG. 4 is an extended out view of a terminal for an electric connector according to the present invention.
Figure 6:
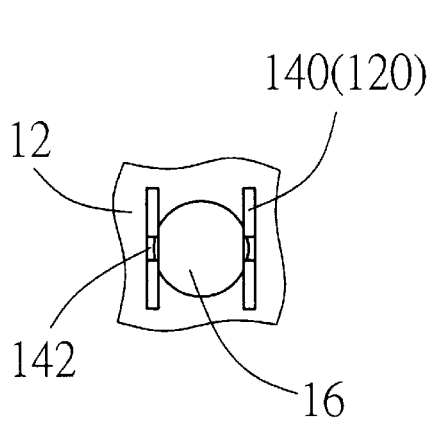
FIG. 6 is a bottom view of a part of the electric connector according to the present invention.
Figure 7:
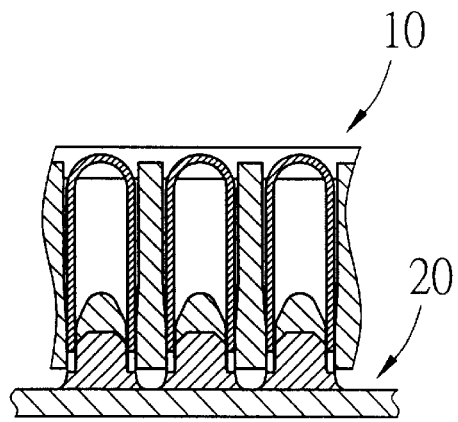
FIG. 7 is a sectional view showing the electric connector bonded to a circuit board according to the present invention.

The terminals 14 are respectively made of a metal plate stamped into a substantially U-shaped profile, each having two bonding ends 140 and a round notch 142 on the middle of each bonding end 140 (see FIG. 4). The housing 12 has a protruded block 122 suspended in each terminal slot 120 near the bottom side (see FIG. 5). The protruded block 122 is adapted to support one solder ball 16 in the bottom side of the housing 12 in the respective terminal slot 120. Further, the protruded block 122 is equally spaced from the two opposite lateral sidewalls of the respective terminal slot 120 at a distance, which is greater than the thickness of each bonding end 140 of each terminal 140. During installation, the bonding ends 140 of the terminals 14 are respectively aimed at the terminal slots 120, and then the terminals 14 are respectively inserted into the terminal slots 120 to force the two bonding ends 140 of each terminal 14 in between the two opposite lateral sidewalls of the corresponding terminal slot 120 and the corresponding protruded block 122, and then the solder balls 16 are respectively inserted into the terminal slots 120 from the bottom side of the housing 12 and peripherally pressed on the two bonding ends 140 of each terminal 14 against the two opposite lateral sidewalls of each terminal slot 120.

The presence of the protruded block 122 in each terminal slot 120 prevents excessive insertion of the corresponding solder ball 16. The protruded block 122 stops the corresponding solder ball 16 in the bottom side of the housing 12, preventing a siphon effect in the corresponding terminal slot 120 when soldering the corresponding solder ball 16 to a circuit board 20 (see FIG. 7). Because the protruded block 122 and the two bonding ends 140 of the terminal 14 hold the corresponding solder ball 16 in the bottom side of the housing 12 and block the upper side of the solder ball 16, a solder tin of predetermined shape is formed when the corresponding solder ball 16 soldered to the circuit board 20 and cooled down. Further, the round notch 142 of each bonding end 140 ensures positive positioning of the corresponding solder ball 16 (see FIG. 6).

Figure 8:
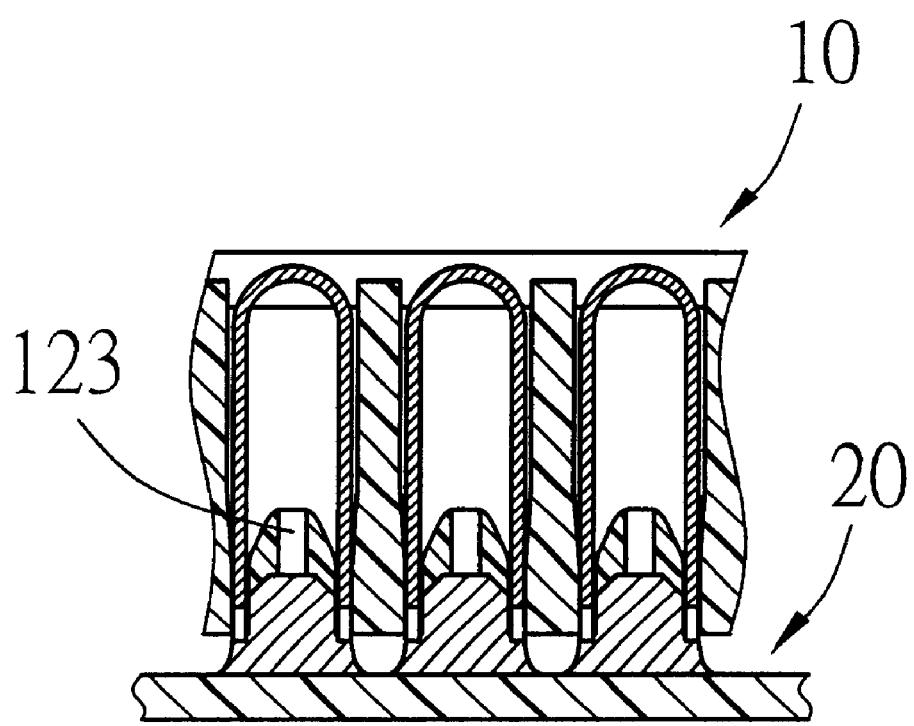
FIG. 8 is a sectional view of an alternate form of the present invention, showing a through hole formed in each protruded block of the housing.

Referring to FIG. 8, each protruded block 122 of the housing 10 has a through hole 123 through which hot air is blown to the corresponding solder ball 16 when soldering the corresponding solder ball 16 to the circuit board 20.

A prototype of electric connector has been constructed with the features of FIGS. 4–7. The electric connector functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electric connector comprising an electrically insulative housing, said housing having a top side, a bottom side, a plurality of terminal slots extended through said top side and said bottom side, a plurality of U-shaped terminals respectively mounted in said terminal slots, said terminals each having two bonding ends, and a plurality of solder balls located on the bottom side of said housing and respectively connected to the bonding ends of said terminals in said terminal slots, wherein said housing comprises a plurality of protruded blocks integrally formed within said housing and respectively suspended in said terminal slots near said bottom side and equally spaced from two opposite lateral sides of each of said terminal slots and adapted to support said solder balls in said bottom side and the two bonding ends of each of said terminals in contact with each of said solder balls respectively.

2. The electric connector as claimed in claim 1, wherein each of the bonding ends of each of said terminals each have a round notch for the positioning of the corresponding solder ball.

3. The electric connector as claimed in claim 2, wherein the bonding ends of each of said terminals form with the protruded block of a corresponding terminal slot means that blocks one side of the corresponding solder ball in the corresponding terminal slot.

4. The electric connector as claimed in claim 2, wherein the two bonding ends of each of said terminals are respectively jammed in between two opposite lateral sidewalls of the corresponding terminal slot and two opposite lateral sides of the protruded block in the corresponding terminal slot.

5. The electric connector as claimed in claim 1, wherein the plurality of protruding blocks remain after soldering of the plurality of solder balls.

6. An electric connector comprising an electrically insulative housing, said housing having a top side, a bottom side, a plurality of terminal slots extended through said top side and said bottom side, a plurality of U-shaped terminals respectively mounted in said terminal slots, said terminals each having two bonding ends, and a plurality of solder balls located on the bottom side of said housing and respectively connected to the bonding ends of said terminals in said terminal slots, wherein said housing comprises a plurality of protruded blocks respectively suspended in said terminal slots near said bottom side and equally spaced from two opposite lateral sides of each of said terminal slots and adapted to support said solder balls in said bottom side and the two bonding ends of each of said terminals in contact with each of said solder balls respectively and wherein said protruded blocks of said housing each have a through hole for the passing of a hot air for soldering said solder balls.

* * * * *